United States Patent
Werner

(10) Patent No.: US 11,580,382 B2
(45) Date of Patent: Feb. 14, 2023

(54) METHOD AND APPARATUS PROVIDING A TRAINED SIGNAL CLASSIFICATION NEURAL NETWORK

(71) Applicant: Rohde & Schwarz GmbH & Co. KG, Munich (DE)

(72) Inventor: Andreas Werner, Chemnitz (DE)

(73) Assignee: ROHDE & SCHWARZ GMBH & CO. KG, Munich (DE)

(*) Notice: Subject to any disclaimer, the term of this patent is extended or adjusted under 35 U.S.C. 154(b) by 964 days.

(21) Appl. No.: 16/395,395

(22) Filed: Apr. 26, 2019

(65) Prior Publication Data
US 2020/0342308 A1    Oct. 29, 2020

(51) Int. Cl.
| | |
|---|---|
| G01R 13/34 | (2006.01) |
| G06F 17/18 | (2006.01) |
| G06N 20/20 | (2019.01) |
| G06N 3/08 | (2023.01) |
| G06N 3/04 | (2023.01) |

(52) U.S. Cl.
CPC ............... G06N 3/08 (2013.01); G01R 13/34 (2013.01); G06F 17/18 (2013.01); G06N 3/0454 (2013.01); G06N 20/20 (2019.01)

(58) Field of Classification Search
CPC ........ G06N 3/0454; G06N 20/20; G06N 3/08; G06F 17/18; G01R 13/34
See application file for complete search history.

(56) References Cited

U.S. PATENT DOCUMENTS

| | | | |
|---|---|---|---|
| 5,799,133 A | 8/1998 | Hollier et al. | |
| 8,909,575 B2* | 12/2014 | Hunzinger | G06N 3/08 706/25 |
| 10,281,504 B2* | 5/2019 | Mousavi | G01R 19/2513 |
| 10,379,141 B2 | 8/2019 | Deverson et al. | |
| 10,585,121 B2 | 3/2020 | Absher | |
| 11,047,957 B2* | 6/2021 | Mikhailov | G06N 3/088 |
| 2005/0049983 A1* | 3/2005 | Butler | G06N 3/086 706/14 |

(Continued)

FOREIGN PATENT DOCUMENTS

| | | |
|---|---|---|
| EP | 3096152 A1 | 11/2016 |
| EP | 3293528 A2 | 3/2018 |

OTHER PUBLICATIONS

Chen, Y. "Automatic Waveform Classification and Arrival PickingBased on Convolutional Neural Network" Earth and Space Science vol. 6, Issue 7 p. 1244-1261.*

(Continued)

*Primary Examiner* — Mia M Thomas
(74) *Attorney, Agent, or Firm* — Westman, Champlin & Koehler, P.A.

(57) ABSTRACT

A method for providing a training data set used for training a signal classification neural network is provided. The method includes generating at least one first virtual waveform primitive comprising a predetermined signal level and at least one second virtual waveform primitive comprising a signal edge. The training data set is formed and comprises a predetermined number of generated virtual waveform primitives including first virtual waveform primitives and second virtual waveform primitives. Each virtual waveform primitive comprises a sequence of time and amplitude discrete values. The training data set is used for training the signal classification neural network.

10 Claims, 4 Drawing Sheets

(56) References Cited

U.S. PATENT DOCUMENTS

| | | | | |
|---|---|---|---|---|
| 2009/0054763 | A1* | 2/2009 | Wang | A61B 8/14 600/453 |
| 2013/0102865 | A1* | 4/2013 | Mandelis | G01N 21/1702 600/328 |
| 2015/0063575 | A1* | 3/2015 | Tan | G06F 16/683 381/56 |
| 2016/0109393 | A1* | 4/2016 | Mandelis | G01N 29/2418 250/341.6 |
| 2016/0341766 | A1 | 11/2016 | Deverson et al. | |
| 2018/0074096 | A1 | 3/2018 | Absher et al. | |
| 2018/0301140 | A1* | 10/2018 | Turcott | G10L 13/00 |
| 2018/0308487 | A1* | 10/2018 | Goel | G10L 15/1815 |
| 2018/0358005 | A1* | 12/2018 | Tomar | G06N 20/10 |
| 2020/0065649 | A1* | 2/2020 | Sandbekkhaug | G16H 40/63 |
| 2020/0121258 | A1* | 4/2020 | Zhu | A61B 5/02125 |
| 2020/0202825 | A1* | 6/2020 | Kolen | G06N 20/00 |
| 2020/0205670 | A1* | 7/2020 | Ralston | B06B 1/04 |
| 2020/0367810 | A1* | 11/2020 | Shouldice | G16H 50/20 |
| 2021/0004041 | A1* | 1/2021 | Qin | G06F 1/08 |
| 2021/0012200 | A1* | 1/2021 | Lyske | G10H 1/0008 |
| 2021/0074266 | A1* | 3/2021 | Lu | H04R 25/70 |
| 2021/0099760 | A1* | 4/2021 | Farre Guiu | H04N 21/8106 |
| 2021/0121089 | A1* | 4/2021 | Blume | G06F 3/017 |
| 2021/0266565 | A1* | 8/2021 | Zhou | G06N 5/04 |
| 2021/0389234 | A1* | 12/2021 | Mandelis | A61B 5/0075 |
| 2022/0287648 | A1* | 9/2022 | Cannesson | A61B 5/02416 |

OTHER PUBLICATIONS

Xue, H. "Using Probabilistic Movement Primitives in Analyzing Human Motion Differences Under Transcranial Current Stimulation" Frontiers in Robotics and AI—Sep. 2021, pp. 1-18.*

Chen, Y. "Automatic Waveform Classification and Arrival Picking Based on Convolutional Neural Network" Advancing Earth and Space Science, Jul. 25, 2019, pp. 1-18.*

* cited by examiner

METHOD AND APPARATUS PROVIDING A TRAINED SIGNAL CLASSIFICATION NEURAL NETWORK

TECHNICAL FIELD

The invention relates to a method and apparatus for providing a training data set used for training a signal classification neural network, and in particular an assistance system for characterizing measured signals processed in a signal analyzing apparatus.

TECHNICAL BACKGROUND

A signal analyzing apparatus such as a digital oscilloscope can process measurement signals received from a probe or other signal source. The signals supplied by a signal source to a signal input of the signal analyzing apparatus are sampled with a sampling rate and stored in an acquisition memory for further processing. With increasing memory size of the acquisition memory, the recording time for recording signals provided by a probe or a signal source is increasing. The acquired signal can be post-processed and displayed on a display unit of the signal analyzing apparatus. However, analyzing of the acquired signal becomes more and more time-consuming and is error-prone because of the high volume of acquired data. Accordingly, the analyzing of the acquired signal displayed on the display unit of the signal analyzing apparatus becomes unpractical and even almost impossible.

Accordingly, there is a need to provide a method and apparatus facilitating the analyzing of acquired measurement signals.

SUMMARY OF THE INVENTION

The invention provides according to a first aspect a method for providing a training data set for training a signal classification neural network, in particular a signal classification neural network for a signal analyzing apparatus,
wherein the method comprises the steps of:
generating at least one first virtual waveform primitive comprising a predetermined signal level and at least one second virtual waveform primitive comprising a signal edge,
forming the training data set comprising a predetermined number of generated virtual waveform primitives including first virtual waveform primitives and second virtual waveform primitives,
wherein each virtual waveform primitive comprises a sequence of time and amplitude discrete values and
using the formed training data set for training the signal classification neural network.

In a possible embodiment of the method according to the first aspect of the present invention, the first virtual waveform primitive comprises a sequence consisting of a number of time and amplitude discrete values representing a specific constant signal level, in particular a constant logical signal level including a high signal level, a low signal level, a top signal level or a zero signal level.

In a further possible embodiment of the method according to the first aspect of the present invention, the second virtual waveform primitive comprises a sequence consisting of a number of time and amplitude discrete values representing a type of a signal edge, in particular a fast rising signal edge, a fast falling signal edge, a slow rising signal edge or a slow falling signal edge.

In a further possible embodiment of the method according to the first aspect of the present invention, further virtual waveform primitives are generated to form part of the training data set, wherein each generated further virtual waveform primitive comprises a sequence of time and amplitude discrete values representing a specific time-dependent function, in particular a polynomial function or a transcendental function.

In a further possible embodiment of the method according to the first aspect of the present invention, the number of generated virtual waveform primitives forming the training data set matches a probability distribution of a signal to be classified by the trained signal classification network.

The invention further provides according to a second aspect a method for performing a signal classification of a signal applied to a signal classification neural network trained with a training data set comprising a predetermined number of virtual waveform primitives each comprising a sequence of time and amplitude discrete values representing a time-dependent function.

In a possible embodiment of the method according to the second aspect of the present invention, the signal applied to the trained signal classification neural network is read from a data acquisition memory of a signal analyzing apparatus.

In a further possible embodiment of the method according to the second aspect of the present invention, the classification result calculated by the trained signal classification neural network in response to the applied signal comprises at least one classification signal indicating a signal portion where the applied signal comprises a specific signal level or comprises a specific type of signal edge.

In a further possible embodiment of the method according to the second aspect of the present invention, the classification signal comprises a first classification signal indicating where signal data of the signal applied to the trained signal classification neural network comprises a specific signal level and/or a second classification signal indicating where signal data of the signal applied to the trained signal classification neural network comprises a specific type of signal edge.

In a further possible embodiment of the method according to the second aspect of the present invention, the signal classification neural network trained with the training data set comprises a recurrent neural network which calculates the classification result in response to the applied signal.

In a further possible embodiment of the method according to the second aspect of the present invention, the signal classification neural network comprises a LSTM recurrent neural network.

In a further possible embodiment of the method according to the second aspect of the present invention, the signal classification neural network comprises a softmax activation function.

In a still further possible embodiment of the method according to the second aspect of the present invention, the signal classification neural network comprises a RMSprop optimizer.

The invention further provides according to a further aspect a signal analyzing apparatus comprising a signal acquisition memory adapted to store data samples of at least one received signal and an assistance system for classifying the received signal having a signal classification neural network trained with a training data set comprising a predetermined number of virtual waveform primitives and used to classify the received signal by processing the data samples of the received signal read from the signal acquisition memory of said signal acquisition apparatus.

In a possible embodiment of the signal analyzing apparatus according to the third aspect of the present invention, the signal analyzing apparatus comprises a digital oscilloscope.

DETAILED DESCRIPTION OF EMBODIMENTS

In the following, possible embodiments of the different aspects of the present invention are described in more detail with reference to the enclosed figures.

Figure 1:
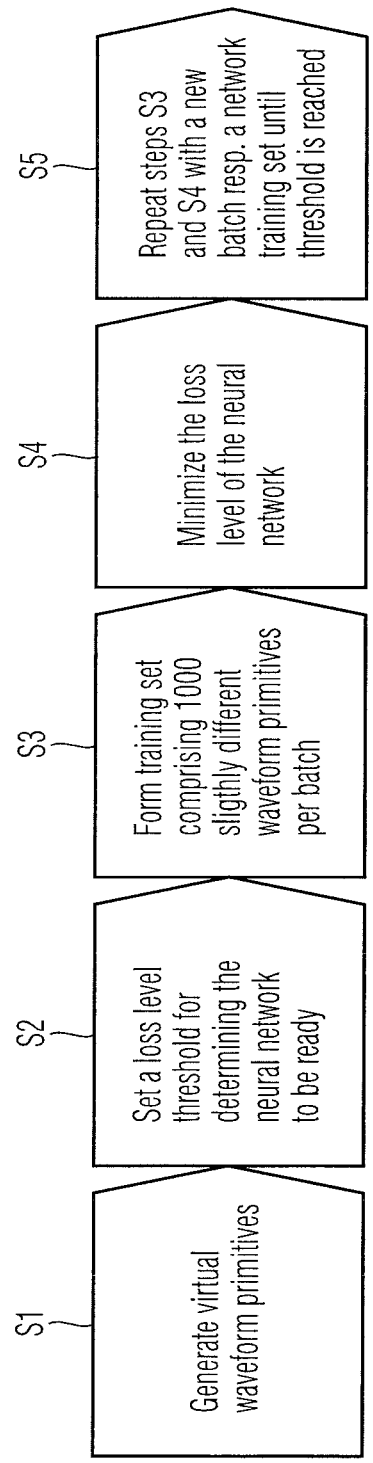
FIG. 1 shows a flowchart of a possible exemplary embodiment of a method for providing a training data set used for training a signal classification neural network according to a first aspect of the present invention.
Figure 4:
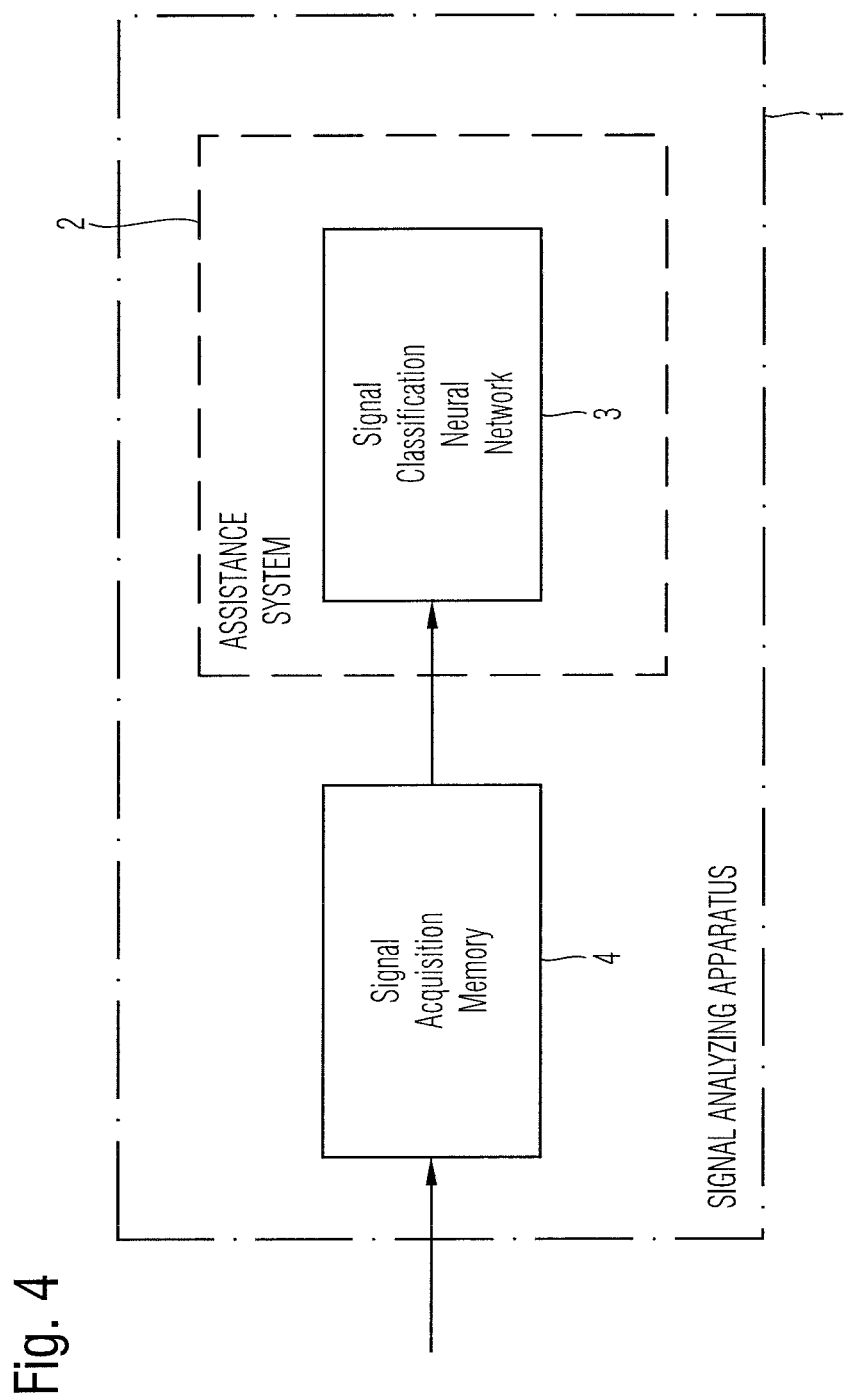
FIG. 4 shows a block diagram for illustrating a possible exemplary embodiment of a signal analyzing apparatus according to a further aspect of the present invention.

FIG. 1 shows a flow diagram for illustrating a possible embodiment of a method for providing a training data set for training a signal classification neural network, in particular a signal classification neural network used in a signal analyzing apparatus as illustrated in the block diagram of FIG. 4.

As can be seen in the flowchart of FIG. 1, the method generates in a first step S1 virtual waveform primitives. In a possible embodiment, at least one first virtual waveform primitive is generated comprising a predetermined signal level. The first virtual waveform primitive comprises in a possible embodiment a sequence consisting of a number of time and amplitude discrete values representing a specific constant signal level including a high signal level, a low signal level, a top signal level or a zero signal level as also illustrated by curves 2A, 2B in FIG. 2. Further, in step S1, at least one second virtual waveform primitive comprising a signal edge is generated. The second virtual waveform primitive comprises in a possible embodiment a sequence consisting of a number of time and amplitude discrete values representing a type of a signal edge, in particular a fast rising signal edge, a fast falling signal edge, a slow rising signal edge or a slow falling signal edge as also illustrated by curves 2D to 2F in FIG. 2. In a possible embodiment, further virtual waveform primitives can also be generated in step S1. These further waveform primitives can comprise a sequence of time and amplitude discrete values representing a specific time-dependent function, in particular a polynomial function or a transcendental function. For instance, the further generated virtual waveform primitive can for instance represent an alternating signal such as a sine or cosine signal, an exponential signal and/or an exponential rising and/or falling signal. In a possible embodiment, the number of generated virtual waveform primitives generated in step S1 do match a probability distribution of a signal to be classified by the signal classification neural network 3.

In a further step S2 of the method illustrated in FIG. 1, a loss level threshold is set for determining whether the trained neural network 3 is ready for operation or not.

Figure 2:
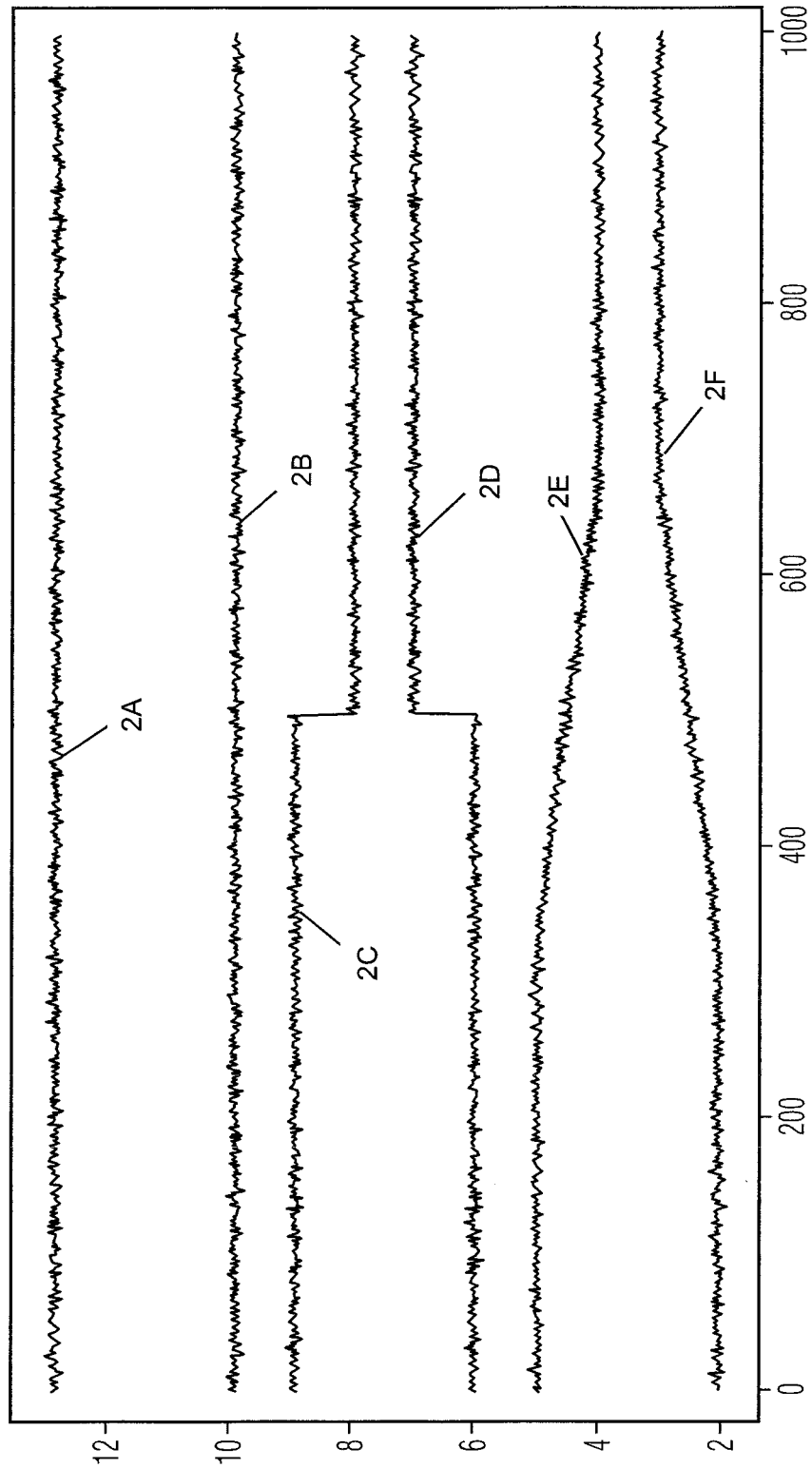
FIG. 2 shows diagrams for illustrating a provision of virtual waveform primitives used by the method according to the first aspect of the present invention.

In a further step S3, a training data set is formed comprising a predetermined number of generated virtual waveform primitives including first virtual waveform primitives and second virtual waveform primitives. Each virtual waveform primitive can comprise a sequence of time and amplitude discrete values as also illustrated in FIG. 2. In a possible embodiment, a training set comprising a number of slightly different waveform primitives can be formed per batch in step S3. For example, a training set comprising about 1,000 slightly different waveform primitives per batch can be formed in step S2.

In a further step S4, the loss level of the signal classification neural network 3 set in step S2 is minimized.

Finally, in step S5, step S3 and step S4 are repeated with a new batch, respectively a new training set until the set loss level is reached and the trained signal classification neural network is ready for operation.

The signal classification neural network 3 trained in the process as illustrated in FIG. 1 can be implemented in a processing unit of the signal analyzing apparatus 1 as also illustrated schematically in FIG. 4. After the signal classification neural network has been trained as illustrated in FIG. 1, and has been implemented in an apparatus, it can be used for performing signal classification. A signal is applied to the trained signal classification neural network 3 of apparatus 1 to perform classification of the applied signal. In a possible embodiment, the signal applied to the trained signal classification neural network 3 can be read from a data acquisition memory 4 of the signal analyzing apparatus 1 as also illustrated in FIG. 4. The classification result calculated by the trained signal classification neural network 3 in response to the applied signal can comprise at least one classification signal or classification marker indicating a signal portion where the applied signal comprises a specific signal level or comprises a specific type of signal edge. The classification signal provided by the signal classification network 3 can comprise a first classification signal indicating where signal data samples of the signal applied to the trained signal classification neural network 3 comprise a specific signal level and/or a second classification signal indicating where signal data samples of the signal applied to the trained signal classification neural network 3 form a specific type of signal edge.

The signal classification neural network 3 trained with the training method as illustrated in FIG. 1 can form part of an assistance system 2 of a signal analyzing apparatus 1 as also shown in FIG. 4. The assistance system 2 can be used for classifying signal signatures of different types within signal recordings. The classified signal signatures or signal portions can be used to search and find interesting signal sections within the received measurement signal. In a possible embodiment, the calculated signal classifications can be used as annotations of the acquired and recorded measurement signal stored for instance in the data acquisition memory 4 of a signal analyzing apparatus 1. The assistance system 2 comprising the signal classification neural network 3 according to the present invention is able not only to use predetermined signal signatures but also signal signatures learned in a machine learning process. The trained signal classification neural network 3 allows to learn any kind of signal signature and to classify a received signal accordingly. In contrast, a conventional signal analyzing apparatus 1 using exact predetermined mathematical algorithms may not detect a specific event, for instance if a threshold value has been slightly missed. Further, the use of predetermined mathematical algorithms in a conventional signal analyzing apparatus offers a very limited number of selectable signal forms or signal signatures. As a consequence, the differentiation between different signal forms or signal signatures such as a signal edge with oscillations and/or electromagnetic disturbances becomes very complex based on mathematical algorithms. In contrast, the trained signal classification neural network 3 according to the present invention can learn any kind of signal signatures and use them for signal classification. Consequently, the assistance system 2 using the trained signal classification neural network 3 trained in the process illustrated in FIG. 1 is much more flexible with respect of the selectable signal signatures and allows to classify signal portions of a received signal precisely. In a possible embodiment, the classified signal portions can be annotated using the classification for further processing. This does facilitate a search for interesting or relevant signal portions within the recorded measurement signal stored for instance in a signal acquisition memory 4 of a signal analyzing apparatus 1.

The method for providing a training data set for training a signal classification neural network 3 as shown in FIG. 1 is based on generated virtual waveform primitives as illustrated in FIG. 2. FIG. 2 illustrates different waveform primitives which can be used for forming a training data set for a signal classification neural network 3 according to the present invention.

Curve 2A in FIG. 2 illustrates a first virtual waveform primitive comprising a sequence of time and amplitude discrete values representing as a specific constant signal level, a top signal level. Curve 2A illustrates the top signal level virtual waveform primitive with some added noise.

Curve 2B in FIG. 2 illustrates a further virtual waveform primitive having a zero signal level with some noise.

Curve 2B in FIG. 2 illustrates a further virtual waveform primitive comprising a signal edge. The virtual waveform primitive illustrated in by curve 2B comprises a sequence consisting of a number of time and amplitude discrete values representing as a type of signal edge a fast falling signal edge. A falling signal edge is a slope extending over a small number of samples such as a slope extending over one to two samples.

Curve 2D of FIG. 2 illustrates a further virtual waveform primitive comprising a sequence representing as a type of signal edge a fast rising signal edge having for instance a slope extending over one to two samples.

Curve 2E of FIG. 2 illustrates a further virtual waveform primitive comprising a sequence consisting of a number of time and amplitude discrete values representing as a type of signal edge a slow falling signal edge. A slow falling signal edge can for instance be defined as a slope extending over a third of the total number n of samples of the respective virtual waveform primitive.

Curve 2F of FIG. 2 illustrates a further virtual waveform primitive comprising a sequence of a number of time and amplitude discrete values representing as a type of a signal edge a slow rising signal edge. A slow rising signal edge comprises a slope extending over a third of the total number n of samples of the waveform primitive.

Accordingly, curves 2A to 2F in FIG. 2 illustrate six different virtual waveform primitives which can be generated to form a training data set used for training a signal classification neural network 3. The signal classification neural network 3 can comprise for instance a recurrent neural network RNN. This recurrent neural network RNN can be formed in a possible embodiment by a LSTM recurrent neural network. The neural network can comprise layers with network nodes having as an activation function a softmax activation function.

The virtual waveform primitives illustrated by curves 2A, 2B in FIG. 2 form a first type of virtual waveform primitives comprising a predetermined signal level. The other virtual waveform primitives illustrated in by curves 2C to 2F in FIG. 2 form a second type of virtual waveform primitives each comprising a signal edge. Besides the two types of first virtual waveform primitives illustrated by curves 2A to 2F, further virtual waveform primitives can be generated to form part of the used training data set. The further virtual waveform primitives can comprise a sequence of time and amplitude discrete values representing a specific time-dependent function. This time-dependent function can be for instance a polynomial function or a transcendental function. The number of different types of generated virtual waveform primitives can vary depending on the use case. In a possible embodiment, the different virtual waveform primitives can be stored in a repository and used for forming a training data set applied to a signal classification neural network 3, in particular a recurrent neural network RNN.

Figure 3:
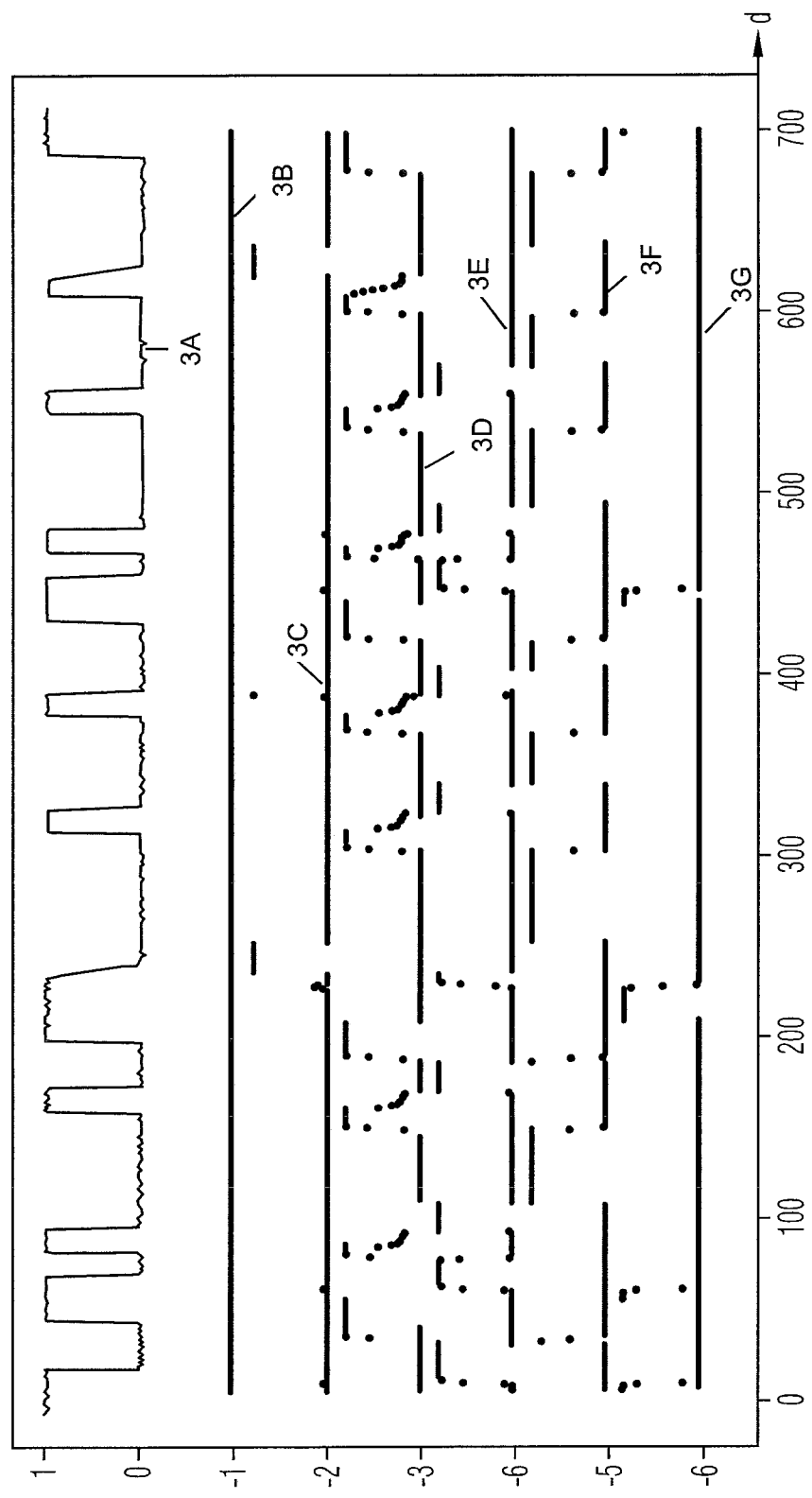
FIG. 3 shows a further diagram for illustrating the method according to the present invention.

FIG. 3 further illustrates the performance of a signal classification neural network 3 using the training method as illustrated in FIG. 1. Curve 3A in FIG. 3 illustrates signal data of a received measurement signal which can be stored in an acquisition memory 4 of a signal analyzing apparatus 1. In a first step as illustrated by curve 3B in FIG. 3, a first classification is output by the neural network 3. The first classification output comprises an indicator where the signal data comprises a slow rising signal edge.

As can be seen, the first classification indicates that the stored signal data does not comprise a signal portion with a slow rising signal edge. As illustrated by curve 3C in FIG. 3, a second classification is output as an indicator where the stored signal data does comprise a signal portion with a slow falling signal edge. In the example illustrated by curve 3C in FIG. 3, there is some wrong classification due to the imperfection of the not completely trained signal classification neural network 3. The classification illustrates portions of signal data comprising a slow falling signal edge whereas indeed the real signal data stored in the memory does not comprise any signal portion with a slow falling signal edge.

As illustrated by curve 3D in FIG. 3, a third classification is output by the neural network indicating a signal portion where the signal data stored in the acquisition memory 4 comprises a fast rising signal edge.

Curve 3E in FIG. 3 illustrates a fourth classification output by the neural network indicating where the stored signal data comprises portions with a fast falling signal edge. In the example of curve 3E in FIG. 3, it is illustrated that there is also a wrong classification due to the imperfection of the not completely trained neural network 3.

Curve 3F in FIG. 3 shows a fifth classification output by the neural network 3 outputting an indicator to indicate where the stored signal data comprises a zero level.

Curve 3G in FIG. 3 shows a sixth classification output by the neural network outputting as an indicator where the signal data comprises a top level. As can be seen from curve 3E in FIG. 3, at a specific time, no top level is classified by the neural network, because the neural network has been trained with top level over e.g. 25 samples, however, at the indicated time, the stored signal data has a shorter top level which is thus not classified in the appropriate manner.

FIG. 4 shows a block diagram of a possible exemplary embodiment of a signal analyzing apparatus 1 having an assistance system 2 with an implemented signal classification neural network 3 which can be trained by the training process as illustrated in FIG. 1. The signal analyzing apparatus 1 comprises a signal acquisition memory 4 adapted to acquire a measured signal to be classified by the signal classification neural network 3. The signal analyzing apparatus 1 comprises in a possible embodiment a digital oscilloscope. In a possible embodiment, a measurement signal can represent a dynamic physical quantity over time acquired by the signal analyzing apparatus 1. For instance, an analog measurement signal can be detected by a probe attached to a measurement object or device under test DUT. The analog measurement signal provided by the probe can in a possible embodiment be converted by an analog to digital converter into a digital measurement signal acquired in an acquisition process and stored in the signal acquisition memory 4 of the signal analyzing apparatus 1. The assistance system 2 of the signal analyzing apparatus 1 can be used for classifying portions of the received signal. The assistance system 2 can comprise processing means for implementing the signal classification neural network 3. The signal classification neural network 3 has been trained with a training set comprising a predetermined number of virtual waveform primitives which is used to classify the received signal by processing data samples stored in the signal acquisition memory 4 and read by the assistance system 2 to be processed by the signal classification neural network 3. The signal classification neural network 3 receives signal data samples read from the data acquisition memory 4 and calculates a classification result in response to the applied signal data samples wherein the classification result indicates at least one signal portion where the applied signal data comprises a signal portion matching a virtual waveform primitive, in particular a specific signal level or a specific type of signal edge. In a possible embodiment, the signal classification neural network 3 can calculate as a classification result a first classification signal indicating where signal data of the signal applied to the trained signal classification neural network 3 comprises a specific signal level and/or a second classification signal indicating where signal data of the signal applied to the trained signal classification neural network 3 comprises a specific type of signal edge. The signal classification neural network 3 can calculate further classification signals indicating where signal data of the stored signal read from the signal acquisition memory 4 comprises a sequence of time and amplitude discrete values representing a defined time-dependent function, for instance a periodic function, a polynomial function and/or a transcendental function. In a possible embodiment, the classification signals output by the signal classification neural network 3 can be stored temporarily as markers or annotations or labels in a local memory of the assistance system 2 and attached to the data samples of the signal stored in the signal acquisition memory 4. These annotations can be used in a possible embodiment by a user of the signal analyzing apparatus 1 to search and find specific portions within the acquired signal stored in the signal acquisition memory 4 for further processing. In a further possible embodiment, the annotated signal stored in the signal acquisition memory having the annotations provided by the signal classification neural network 3 can be processed to detect automatically specific events within the measurement signal such as falling and rising signal edges which can be used as trigger events by the signal analyzing apparatus 1. The assistance system 2 as illustrated in FIG. 4 can be used as a supplement to assisting systems using predetermined algorithms for event detection. Accordingly, the assistance system 2 illustrated in the embodiment of FIG. 4 can be combined with conventional systems used in a signal analyzing apparatus 1, in particular a horizontal or vertical trigger system of a digital oscilloscope.

The signal analyzing apparatus 1 such as a digital oscilloscope can comprise a vertical subsystem allowing to portion and scale waveforms illustrated on a display unit of the signal analyzing apparatus 1 vertically. The vertical system can address an attenuation and/or amplification of the received signal. The signal analyzing apparatus 1 can further comprise a horizontal system to control an amount of time per division across a screen of the display unit. The triggering system of the signal analyzing apparatus 1 allows a user to select and modify any actions related to specific types of triggers. In a possible embodiment, the classification signals output by the signal classification neural network 3 can be processed to select and modify automatically triggering actions. In a possible embodiment, the signal analyzing apparatus 1 comprises an analog to digital converter which is adapted to convert the received analog signal into a digital measurement signal. The analog to digital converter samples the received signal at discrete points in time and provides data samples which can be supplied to an acquisition and processing unit of the signal analyzing apparatus 1. Different acquisition modes can be employed to acquire a digital signal stored in the signal acquisition memory 4 of the signal analyzing apparatus 1. Different types of acquisition modes can for instance comprise a High-Res mode or an RMS mode. The signal analyzing apparatus 1 has the ability to store digital signals which can be viewed later on a display unit. The front panel of the signal analyzing apparatus 1 can comprise buttons which allow to start and stop the acquisition of the measurement signal. It is also possible that the apparatus 1 does automatically stop acquiring a signal after one acquisition is completed or after one set of records has been turned into an envelope or average waveform. The acquired measurement signal is stored in the acquisition memory 4 for further processing, in particular for classification by the signal classification neural network 3.

In a preferred embodiment, the signal classification neural network 3 comprises a recurrent neural network RNN. Recurrent neural networks RNN comprise loops which allow information to persist. In a possible embodiment, the recurrent neural network RNN is formed by an LSTM (Long Short-Term Memory) neural network. The LSTM network is capable of learning long-term dependencies.

In a possible embodiment, the assistance system 2 of the signal analyzing apparatus 1 can interact with a user interface of the signal analyzing apparatus 1, in particular for searching and finding signal portions of a signal stored in the signal acquisition memory 4 using the annotations provided by the signal classification neural network 3. In a possible embodiment, the virtual waveform primitives used for generating the training data set for training the signal classification neural network 3 can be generated by a signal generator and stored in a repository. The repository can include a library of different virtual waveform primitives which can be used for forming a training data set. The different virtual waveform primitives can be stored in a local database of the signal analyzing apparatus 1 or in a remote database. In a further possible embodiment, the generated virtual waveform primitives can be displayed to a training operator training the signal classification neural network 3. The training operator may edit and adapt the different virtual waveform primitives according to the use case and the expected measurement signals. The signal classification neural network 3 trained by application of training data sets as illustrated in the process of FIG. 1 can be implemented in any kind of signal analyzing apparatus 1 used for analyzing an analog or digital signal received from a signal source via a transmission channel or derived from a device under test DUT by means of a probe. In a possible embodiment, the virtual waveform primitives used for forming the training data set can be derived from a circuit design of a device under test DUT to be analyzed by the signal analyzing apparatus 1. Further, different virtual waveform primitives stored in the repository can be selected automatically depending on a type or identifier of a device under test DUT to be analyzed by the signal analyzing apparatus 1 or transported in a transmission channel.

The invention claimed is:

1. A method for providing a training data set used for training a signal classification neural network, the method comprising the steps of:
(a) generating at least one first virtual waveform primitive comprising a predetermined signal level and at least one second virtual waveform primitive comprising a signal edge;
(b) forming the training data set comprising a predetermined number of generated virtual waveform primitives including first virtual waveform primitives and second virtual waveform primitives,
wherein each virtual waveform primitive comprises a sequence of time and amplitude discrete values and
(c) using the training data set for training the signal classification neural network.

2. The method according to claim 1 wherein the first virtual waveform primitive comprises
a sequence consisting of a number of time and amplitude discrete values representing a specific constant signal level, in particular a constant logical signal level including a high signal level, a low signal level, a top signal level or a zero signal level.

3. The method according to claim 1 wherein the second virtual waveform primitive comprises
a sequence consisting of a number of time and amplitude discrete values representing a type of a signal edge, in particular a fast rising signal edge, a fast falling signal edge, a slow rising signal edge or a slow falling signal edge.

4. The method according to claim 1 wherein further virtual waveform primitives are generated to form part of the training data set,
wherein each generated further virtual waveform primitive comprises a sequence of time and amplitude discrete values representing a specific time-dependent function, in particular a polynomial function or a transcendental function.

5. The method according to claim 1 wherein the number of generated virtual waveform primitives forming said training data set matches a probability distribution of a signal to be classified by the trained signal classification network.

6. A method for performing a signal classification of a signal applied to a signal classification neural network trained with a training data set comprising a predetermined number of virtual waveform primitives each comprising a sequence of time and amplitude discrete values representing a time-dependent function, wherein the signal applied to the trained signal classification neural network is read from a data acquisition memory of a signal analyzing apparatus.

7. A method for performing a signal classification of a signal applied to a signal classification neural network trained with a training data set comprising a predetermined number of virtual waveform primitives each comprising a sequence of time and amplitude discrete values representing a time-dependent function, wherein a classification result calculated by the trained signal classification neural network in response to the applied signal comprises at least one classification signal indicating a signal portion where the applied signal comprises a specific signal level or comprises a specific type of signal edge.

8. The method according to claim 7 wherein the classification signal comprises
a first classification signal indicating where the signal data of the signal applied to the trained signal classification neural network comprises a specific signal level and/or
a second classification signal indicating where the signal data of the signal applied to the trained signal classification neural network comprises a specific type of signal edge.

9. A signal analyzing apparatus, the signal analyzing apparatus comprising
a signal acquisition memory adapted to store data samples of at least one received signal; and
an assistance system for classifying the received signal having a signal classification neural network trained with a training data set comprising a predetermined number of virtual waveform primitives and used to classify the received signal by processing the data samples of the received signal read from the signal acquisition memory of said signal acquisition apparatus.

10. The signal analyzing apparatus of claim 9 wherein the signal analyzing apparatus 1 comprises a digital oscilloscope.

* * * * *